(12) United States Patent
Togawa et al.

(10) Patent No.: US 9,604,335 B2
(45) Date of Patent: Mar. 28, 2017

(54) WAFER POLISHING APPARATUS

(71) Applicant: EBARA CORPORATION, Tokyo (JP)

(72) Inventors: Tetsuji Togawa, Tokyo (JP); Atsushi Yoshida, Tokyo (JP); Toshifumi Watanabe, Tokyo (JP)

(73) Assignee: Ebara Corporation, Tokyo (JP)

( * ) Notice: Subject to any disclaimer, the term of this patent is extended or adjusted under 35 U.S.C. 154(b) by 0 days.

(21) Appl. No.: 15/188,638

(22) Filed: Jun. 21, 2016

(65) Prior Publication Data

US 2016/0297048 A1    Oct. 13, 2016

Related U.S. Application Data

(62) Division of application No. 14/167,898, filed on Jan. 29, 2014, now Pat. No. 9,399,274.

(30) Foreign Application Priority Data

Jan. 30, 2013 (JP) ................................ 2013-015937

(51) Int. Cl.
  *B24B 9/06* (2006.01)
  *H01L 21/463* (2006.01)
  *B24B 21/00* (2006.01)
  *H01L 21/02* (2006.01)

(52) U.S. Cl.
  CPC ............ *B24B 9/065* (2013.01); *B24B 21/002* (2013.01); *B24B 21/008* (2013.01); *H01L 21/02035* (2013.01); *H01L 21/463* (2013.01)

(58) Field of Classification Search
  CPC  B24B 7/228; B24B 9/065; B24B 9/08; B24B 9/107; B24B 21/002; B24B 21/008; B24B 27/0076; H01L 21/463
  See application file for complete search history.

(56) References Cited

U.S. PATENT DOCUMENTS

| | | |
|---|---|---|
| 6,302,769 B1 | 10/2001 | Nishi et al. |
| 6,533,644 B1 | 3/2003 | Horie et al. |
| 8,187,055 B2 | 5/2012 | Takahashi et al. |
| 8,445,360 B2 | 5/2013 | Nakanishi et al. |
| 8,540,551 B2 | 9/2013 | Brown et al. |
| 2007/0270084 A1 | 11/2007 | Aida |
| 2012/0100785 A1 | 4/2012 | Ishimasa et al. |
| 2012/0244787 A1 | 9/2012 | Seki et al. |

FOREIGN PATENT DOCUMENTS

| | | |
|---|---|---|
| JP | 2007-335521 A | 12/2007 |
| JP | 2011-171647 A | 1/2011 |
| JP | 2012-213849 A | 8/2012 |

*Primary Examiner* — Timothy V Eley
(74) *Attorney, Agent, or Firm* — Baker & Hostetler LLP

(57) ABSTRACT

An apparatus and method of polishing a substrate is described. The polishing includes: rotating a substrate; pressing a first polishing tool against an edge portion of the substrate to polish the edge portion; and pressing a second polishing tool against the edge portion of the substrate to polish the edge portion. The second polishing tool is located more inwardly than the first polishing tool with respect to a radial direction of the substrate. The first polishing tool has a polishing surface rougher than a polishing surface of the second polishing tool.

8 Claims, 10 Drawing Sheets

WAFER POLISHING APPARATUS

CROSS REFERENCE TO RELATED APPLICATION

This document is a Divisional of U.S. application Ser. No. 14/167,898 filed on Jan. 29, 2014, which claims priority to Japanese Patent Application No. 2013-015937 filed Jan. 30, 2013, the entire contents of which are hereby incorporated by reference.

BACKGROUND

A polishing apparatus, which has a polishing tool (e.g., a polishing tape or a fixed abrasive), is used for polishing a peripheral portion of a wafer. This type of polishing apparatus is configured to bring the polishing tool into contact with the peripheral portion of the wafer, while rotating the wafer, to thereby polish the peripheral portion of the wafer. In this specification, the peripheral portion of the wafer is defined as a region including a bevel portion which is the outermost portion of the wafer and a top edge portion and a bottom edge portion located radially inwardly of the bevel portion.

FIG. 8A and FIG. 8B are enlarged cross-sectional views each showing the peripheral portion of the wafer. More specifically, FIG. 8A shows a cross-sectional view of a so-called straight-type wafer, and FIG. 8B shows a cross-sectional view of a so-called round-type wafer. In the wafer W shown in FIG. 8A, the bevel portion is an outermost circumferential surface of the wafer W (indicated by a symbol B) that is constituted by an upper slope (an upper bevel portion) P, a lower slope (a lower bevel portion) Q, and a side portion (an apex) R. In the wafer W shown in FIG. 8B, the bevel portion is a portion (indicated by a symbol B) having a curved cross section and constituting an outermost circumferential surface of the wafer W. The top edge portion is a flat portion E1 located radially inwardly of the bevel portion B. The bottom edge portion is a flat portion E2 located opposite the top edge portion and located radially inwardly of the bevel portion B. The top edge portion E1 and the bottom edge portion E2 may be collectively referred to as edge portion. The edge portion may include a region where devices are formed.

In a fabrication process of SOI (Silicon on Insulator) substrate, there is a need to form a vertical surface and a horizontal surface on the edge portion of the wafer W, as shown in FIG. 9. The SOI substrate is manufactured by sticking a device substrate and a silicon substrate together. More specifically, as illustrated in FIG. 10A and FIG. 10B, a device substrate W1 and a silicon substrate W2 are stuck together, and as illustrated in FIG. 10C, a back side of the device substrate W1 is scraped away by a grinder. As a result, the SOI substrate as illustrated in FIG. 10D is obtained.

A cross section of the edge portion as illustrated in FIG. 9 can be formed with use of a polishing apparatus shown in FIG. 11. Specifically, while a wafer W is rotated, a pressing member 100 presses an edge of a polishing tape 101 downwardly against the edge portion of the wafer W to thereby polish the edge portion of the wafer W. The polishing tape 101 has its lower surface serving as a polishing surface that holds abrasive grains thereon. This polishing surface is disposed parallel to the wafer W. With the edge of the polishing tape 101 located on the edge portion of the wafer W, the pressing member 100 presses the polishing surface of the polishing tape 101 against the edge portion of the wafer W to thereby form a right-angled cross section as shown in FIG. 9, i.e., the vertical surface and the horizontal surface on the edge portion of the wafer W.

In order to increase a throughput of the polishing apparatus shown in FIG. 11, it is preferable to use a polishing tape having a more abrasive or rough polishing surface. This is because a polishing rate (which is also referred to as a removal rate) of the wafer W is increased. However, use of the polishing tape having the rough polishing surface may roughen the vertical surface of the edge portion of the wafer W. Moreover, the edge portion of the wafer W may become chipped. Use of a polishing tape having a less abrasive or fine polishing surface can form a smooth vertical surface on the edge portion of the wafer W. However, the use of the polishing tape having the fine polishing surface may result in a lowered polishing rate of the wafer W.

SUMMARY OF THE INVENTION

In an embodiment an apparatus is used to polish a substrate. This apparatus is used to rotate a substrate; press a first polishing tool against an edge portion of the substrate to polish the edge portion; and press a second polishing tool against the edge portion of the substrate to polish the edge portion. The second polishing tool is preferably located more inwardly than the first polishing tool with respect to a radial direction of the substrate. The first polishing tool has a polishing surface more abrasive than a polishing surface of the second polishing tool.

According to the above-described embodiment, the first polishing tool first polishes the edge portion of the substrate. Therefore, a contact area between the second polishing tool and the edge portion becomes small, and as a result pressure of the second polishing tool applied to the edge portion is increased. Accordingly, the second polishing tool having a finer polishing surface than the first polishing tool can polish the edge portion of the substrate at a high polishing rate (i.e., a high removal rate). Moreover, the second polishing tool having the fine polishing surface can form a smooth vertical surface on the edge portion of the substrate.

DETAILED DESCRIPTION OF AN EMBODIMENT

An embodiment will now be described in detail with reference to the drawings.

Figure 1:
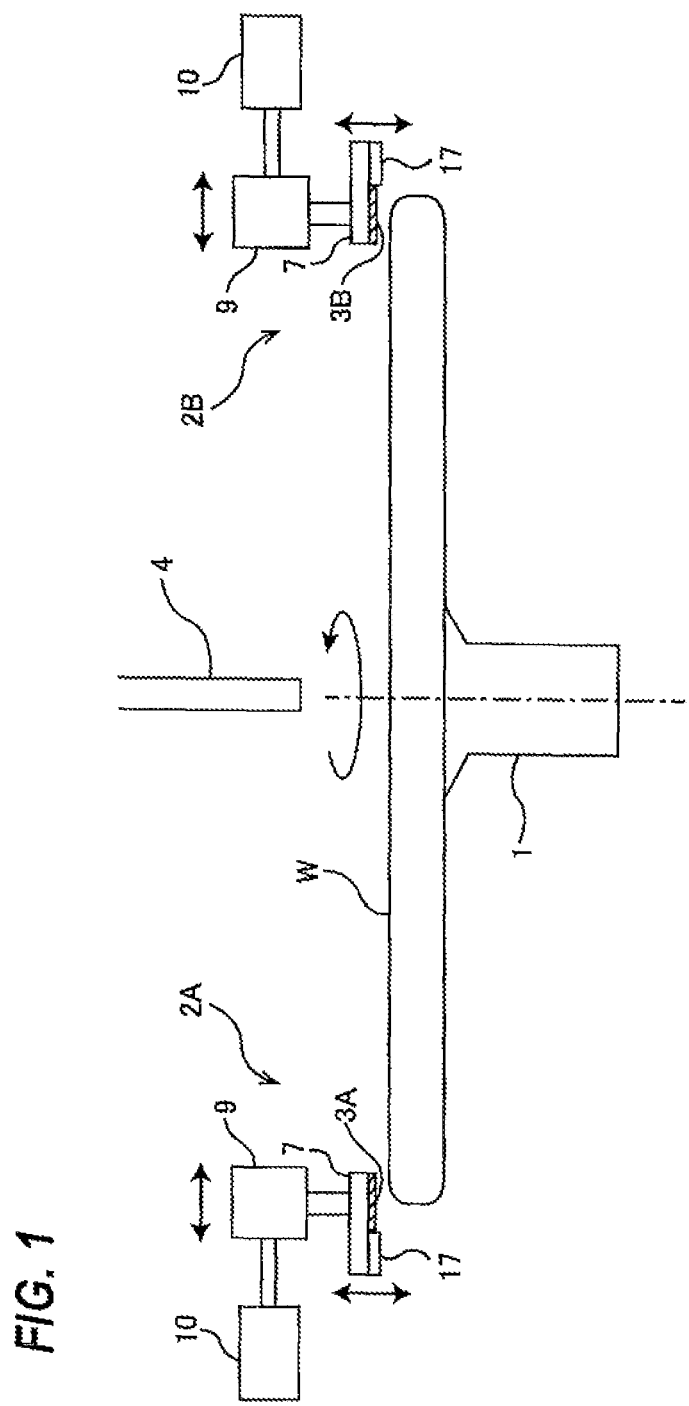
FIG. 1 is a schematic view of a polishing apparatus for carrying out an embodiment of polishing a substrate.
Figure 2:
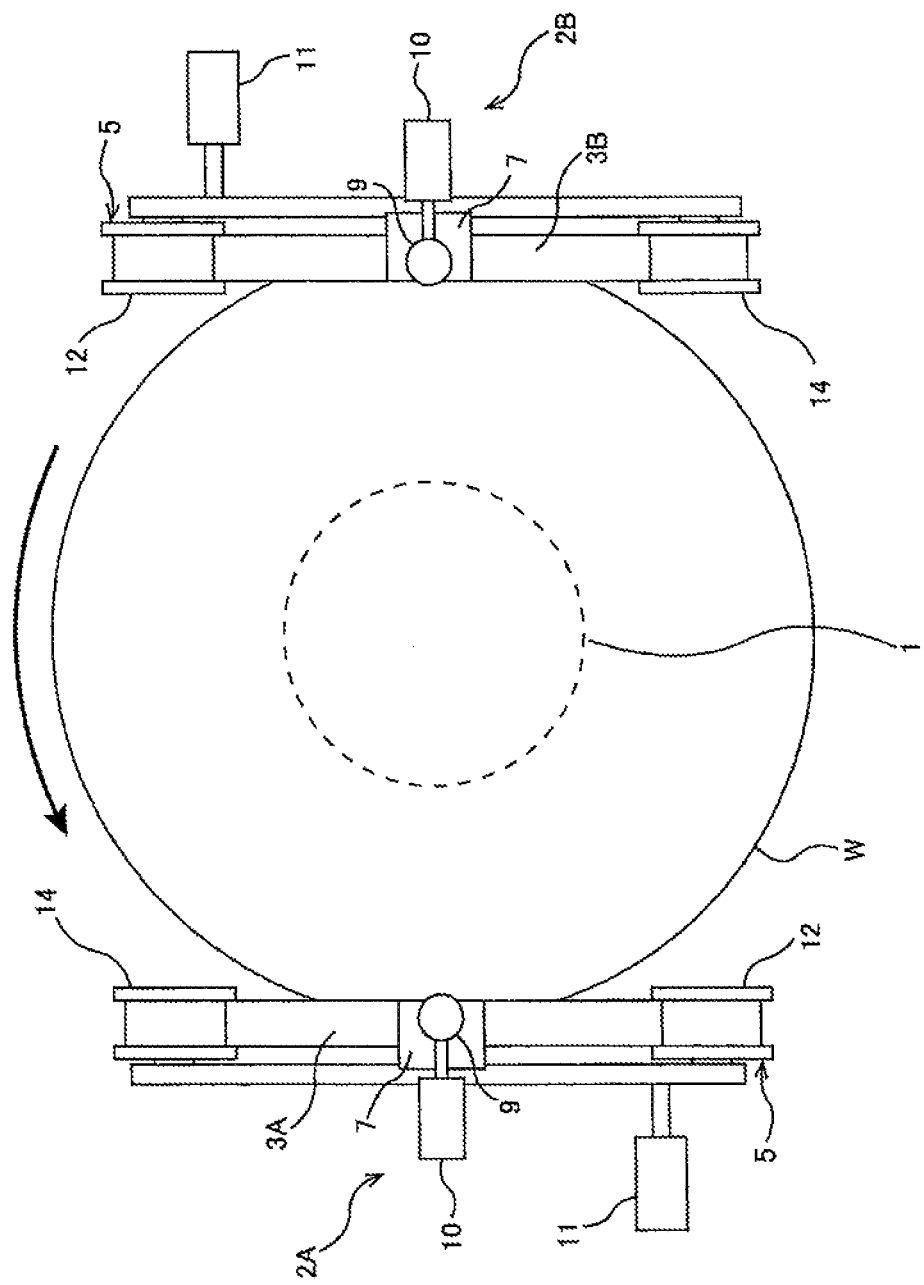
FIG. 2 is a plan view of the polishing apparatus shown in FIG. 1.

FIG. 1 is a schematic view illustrating a polishing apparatus for carrying out an embodiment of a polishing method, and FIG. 2 is a plan view of the polishing apparatus shown in FIG. 1. The polishing apparatus has a substrate holder 1 for holding and rotating a wafer W which is an example of a substrate, a first polishing unit 2A and a second polishing unit 2B for polishing an edge portion of the wafer W when held by the substrate holder 1, and a polishing liquid supply mechanism 4 for supplying a polishing liquid (e.g., pure water) onto a central portion of the wafer W.

An arrangement of the two polishing units 2A, 2B is symmetrical about the wafer W held by the substrate holder 1. The first polishing unit 2A is configured to place a first polishing tape 3A, which is a first polishing tool, in sliding contact with the edge portion of the wafer W to thereby polish the edge portion, and the second polishing unit 2B is configured to place a second polishing tape 3B, which is a second polishing tool, in sliding contact with the edge portion of the wafer W to thereby polish the edge portion. The first polishing tape 3A has a polishing surface rougher than a polishing surface of the second polishing tape 3B. During polishing of the wafer W, the polishing liquid is supplied from the polishing liquid supply mechanism 4 onto the central portion of the wafer W. Examples of the polishing liquid to be used include pure water. Instead of the polishing tape, a grindstone (or a fixed abrasive) may be used as the first polishing tool and/or the second polishing tool.

Since the first polishing unit 2A and the second polishing unit 2B have the same structure, the first polishing unit 2A will be described below. The first polishing unit 2A includes a polishing-tape support mechanism (a polishing-tool support mechanism) 5 for supporting the first polishing tape 3A, a pressing pad (a pressing member) 7 for pressing the first polishing tape 3A downwardly against the edge portion of the wafer W, a vertically moving mechanism 9 for moving the pressing pad 7 in a direction perpendicular to the wafer surface, a pressing-pad moving mechanism (a pressing-member moving mechanism) 10 for moving the pressing pad 7 and the vertically moving mechanism 9 in a radial direction of the wafer W, and a tape moving mechanism (a polishing-tool moving mechanism) 11 for moving the first polishing tape 3A and the polishing-tape support mechanism 5 in the radial direction of the wafer W.

The pressing-pad moving mechanism 10 and the tape moving mechanism 11 are operable independently of each other. Therefore, a relative position of the pressing pad 7 and the first polishing tape 3A in the radial direction of the wafer W can be adjusted by the pressing-pad moving mechanism 10 and the tape moving mechanism 11. A combination of pneumatic cylinders, a combination of a servomotor and a ball screw, or the like can be used as the vertically moving mechanism 9, the pressing-pad moving mechanism 10, and the tape moving mechanism 11.

The polishing-tape support mechanism 5 includes a feeding reel 12 for feeding the first polishing tape 3A to the pressing pad 7 and a take-up reel 14 for taking up the first polishing tape 3A. The first polishing tape 3A extends from the feeding reel 12 to the take-up reel 14 via the pressing pad 7. The first polishing tape 3A is supported by the polishing-tape support mechanism 5 such that the polishing surface of the first polishing tape 3A lies parallel to the surface of the wafer W and the polishing surface faces the edge portion of the wafer W.

One surface (a lower surface) of the first polishing tape 3A constitutes the polishing surface having abrasive grains fixed thereto. The first polishing tape 3A is a long polishing tool, and is disposed along a tangential direction of the wafer W. The pressing pad 7 is a pressing member for pressing the first polishing tape 3A against the edge portion of the wafer W, and is disposed above the edge portion of the wafer W. The first polishing tape 3A is located between the pressing pad 7 and the edge portion of the wafer W. A tape stopper 17 for restricting an outward movement of the first polishing tape 3A is fixed to a bottom of the pressing pad 7. This tape stopper 17 may be omitted.

Figure 3:
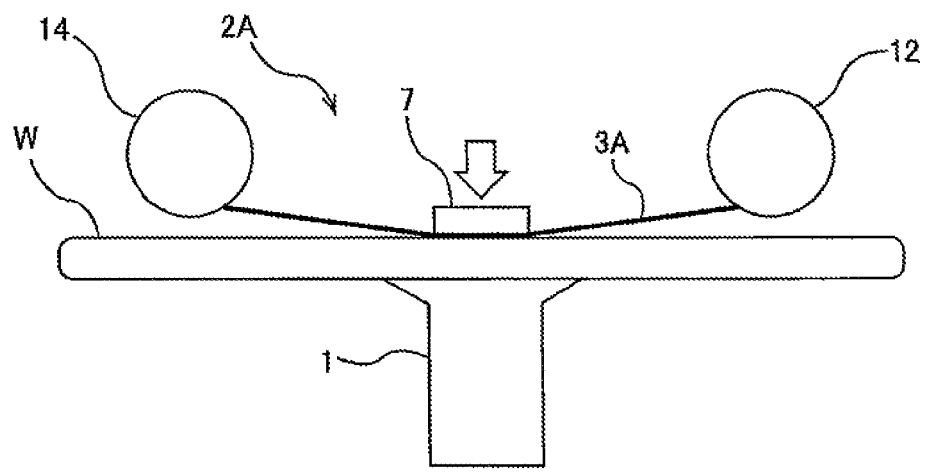
FIG. 3 is a side view showing a state in which a pressing pad is pressing a first polishing tape against an edge portion of a wafer to polish the edge portion of the wafer.

FIG. 3 is a side view showing a state in which the pressing pad 7 is pressing the first polishing tape 3A against the edge portion of the wafer W to polish the edge portion of the wafer W. The first polishing unit 2A polishes the edge portion of the wafer W with the use of the first polishing tape 3A. Similarly, the second polishing unit 2B polishes the edge portion of the wafer W with the use of the second polishing tape 3B which is different from the first polishing tape 3A. The first polishing tape 3A has the polishing surface which is rougher than the polishing surface of the polishing tape 3B. For example, the first polishing tape 3A is a polishing tape having a rough polishing surface for rough-polishing of the wafer, while the second polishing tape 3B is a polishing tape having a fine polishing surface for finish-polishing of the wafer.

Figure 4:
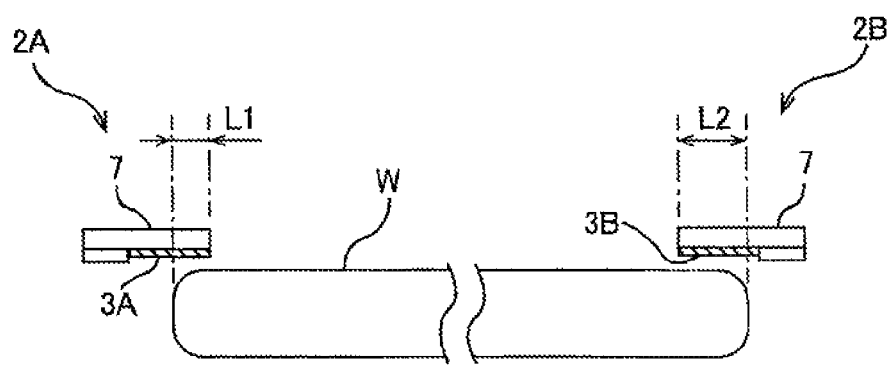
FIG. 4 is a diagram illustrating an arrangement of the first polishing tape and a second polishing tape.

As shown in FIG. 4, the second polishing tape 3B and the pressing pad 7 of the second polishing unit 2B are located more inwardly than the first polishing tape 3A and the pressing pad 7 of the first polishing unit 2A with respect to the radial direction of the wafer W. More specifically, as shown in FIG. 4, a distance L1 between an inner edge of the first polishing tape 3A and the outermost periphery of the wafer W is shorter than a distance L2 between an inner edge of the second polishing tape 3B and the outermost periphery of the wafer W. Therefore, the second polishing tape 3B polishes a region in the edge portion lying radially inwardly of the first polishing tape 3A.

Figure 5A:
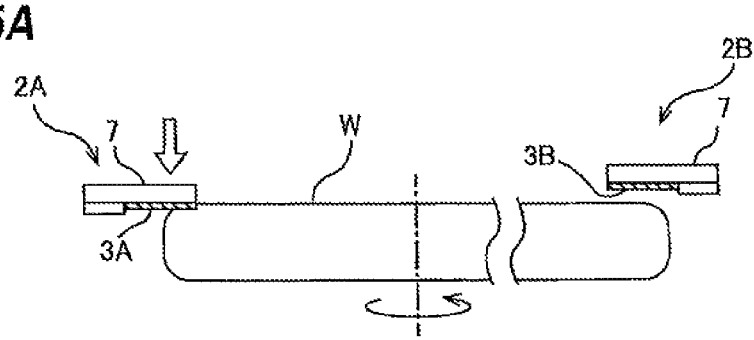
FIG. 5A, FIG. 5B, and FIG. 5C are views each showing an embodiment of the polishing method.
Figure 5B:
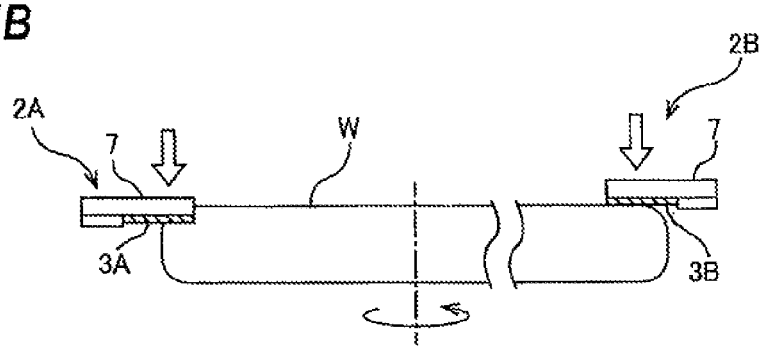
Figure 5C:
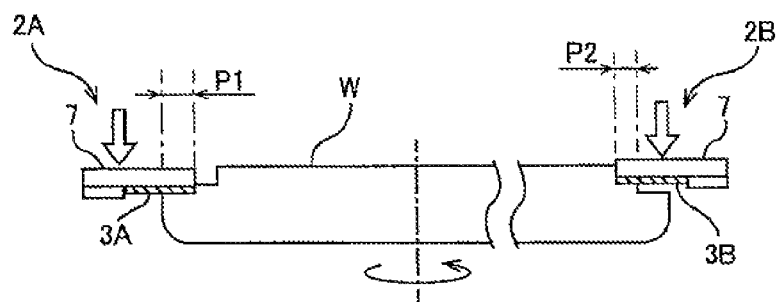

FIG. 5A through FIG. 5C are views each showing an embodiment of the polishing method. The wafer W is rotated about its axis by the substrate holder 1 (see FIG. 1 and FIG. 2). In this state, as shown in FIG. 5A, the first polishing tape 3A is firstly brought into contact with the edge portion of the wafer W to start polishing of the edge portion. At this time, the second polishing tape 3B is located away from the wafer W. After a predetermined time has elapsed from a time when the first polishing tape 3A is brought into contact with the wafer W (i.e., a time when the first polishing tape 3A starts polishing of the edge portion of the wafer W), the second polishing tape 3B is brought into contact with the edge portion of the wafer W to start polishing of the edge portion, as shown in FIG. 5B. Further, as shown in FIG. 5C, the pressing pads 7, 7 of the polishing units 2A, 2B are moved downwardly to press the first polishing tape 3A and the second polishing tape 3B against the edge portion of the wafer W, thereby forming vertical surfaces and horizontal surfaces on the edge portion of the wafer W. Although not shown in FIG. 5A through FIG. 5C, the polishing liquid is supplied from the polishing liquid supply mechanism 4 onto the upper surface of the wafer W.

Each pressing pad 7 has a wafer pressing surface (i.e., a substrate pressing surface) which is a horizontal surface parallel to the wafer surface. The polishing units 2A, 2B individually form the vertical surfaces and the horizontal surfaces on the edge portion of the wafer W by pressing the polishing tapes 3A, 3B against the edge portion of the wafer W with the respective horizontal wafer pressing surfaces. The polishing surfaces of the polishing tapes 3A, 3B when contacting the wafer W are parallel to the surface of the wafer W.

As can be seen from FIG. 5C, the first polishing tape 3A is firstly started to polish an outer region of the edge portion of the wafer W, and subsequently the second polishing tape 3B is started to polish an inner region of the edge portion of the wafer W. A contact width P1 of the first polishing tape 3A when contacting the edge portion may preferably be equal to or larger than a contact width P2 of the second polishing tape 3B when contacting the edge portion. This is for reducing a contact area between the second polishing tape 3B and the edge portion of the wafer W so as to increase a polishing pressure of the second polishing tape 3B applied to the edge portion of the wafer W. The above-described contact width is a contact width in the radial direction of the wafer W.

In order to allow the first polishing tape 3A to polish the edge portion of the wafer ahead of the second polishing tape 3B throughout the polishing of the wafer, a removal rate (or a polishing rate) of the edge portion polished by the first polishing tape 3A is preferably higher than a removal rate (or a polishing rate) of the edge portion polished by the second polishing tape 3B.

Figure 6:
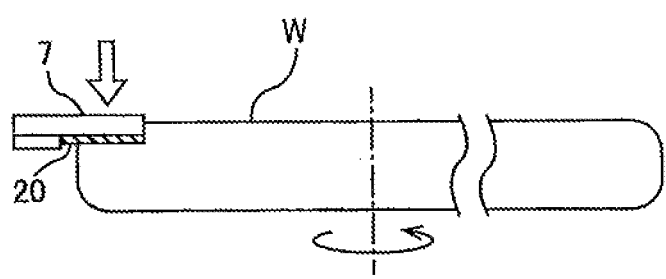
FIG. 6 is a view illustrating a manner of polishing the edge portion of the wafer with use of a single polishing tape.

FIG. 6 is a view illustrating a manner of polishing the edge portion of the wafer W with use of a single polishing tape 20. As can be seen from a comparison between FIG. 6 and FIG. 5C, the contact area between the first polishing tape 3A and the wafer W and the contact area between the second polishing tape 3B and the wafer W are smaller than a contact area between the wafer W and the polishing tape 20 shown in FIG. 6. This means that pressure of each of the first polishing tape 3A and the second polishing tape 3B exerted on the wafer W is higher than pressure of the polishing tape 20 exerted on the wafer W. Therefore, the first polishing tape 3A and the second polishing tape 3B can polish the edge portion of the wafer W at a high polishing rate.

Figure 7A:
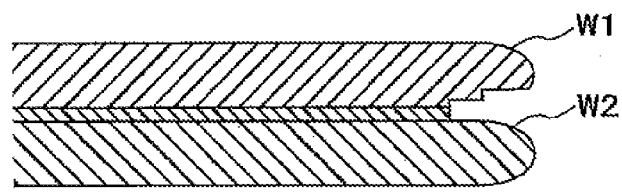
FIG. 7A, FIG. 7B, and FIG. 7C are diagrams showing a process of fabricating an SOI (Silicon on Insulator) substrate using a substrate that has been polished by the polishing apparatus according to the embodiment.
Figure 7B:
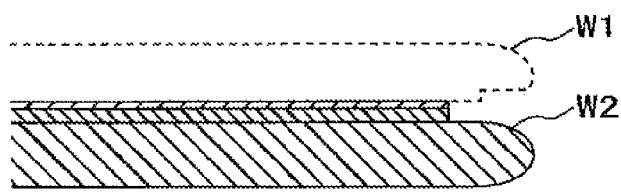
Figure 7C:
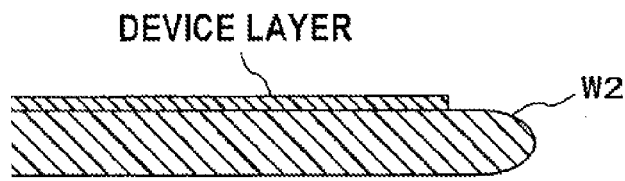
Figure 8A:
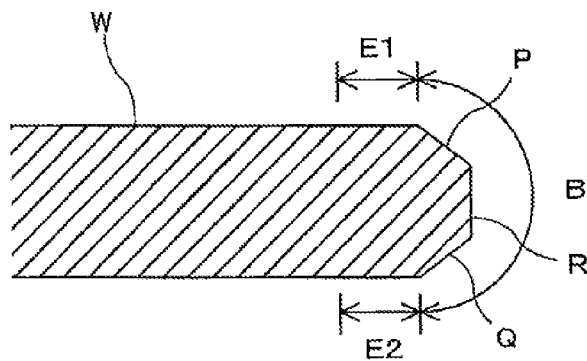
FIG. 8A and FIG. 8B are cross-sectional views each showing a peripheral portion of a wafer.
Figure 8B:
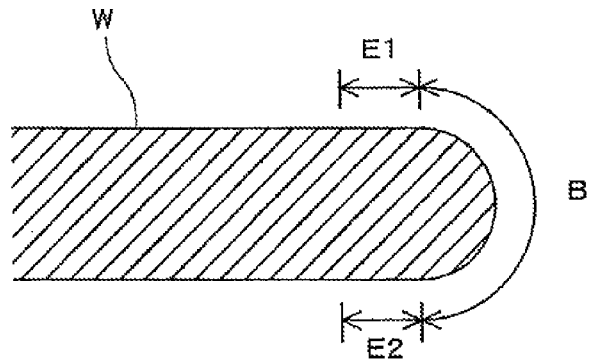
Figure 9:
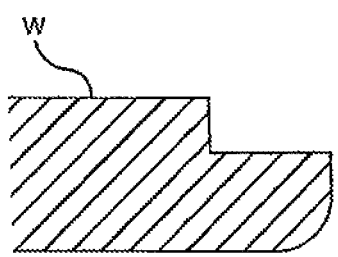
FIG. 9 is a view showing a vertical surface and a horizontal surface formed on the edge portion of the wafer.
Figure 10A:
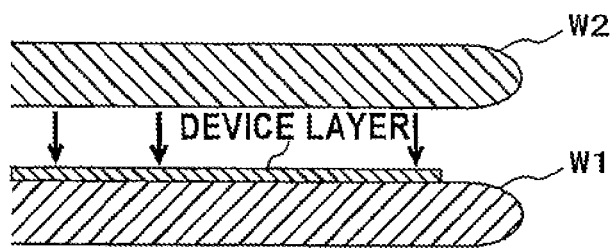
FIG. 10A, FIG. 10B, FIG. 10C, and FIG. 10D are diagrams showing a process of fabricating an SOI substrate.
Figure 10B:
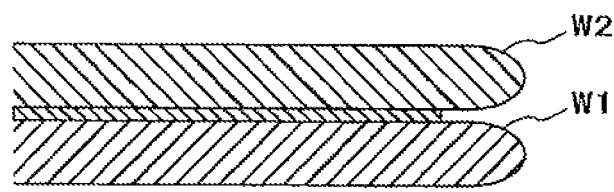
Figure 10C:
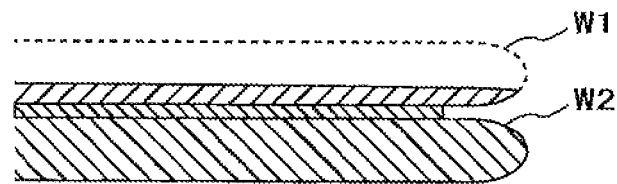
Figure 10D:
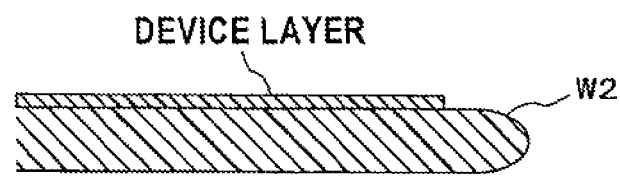
Figure 11:
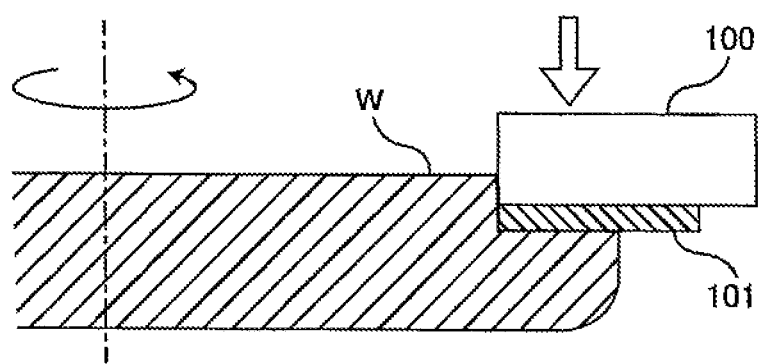
FIG. 11 is a diagram showing an example of a polishing apparatus that can form a cross section of the edge portion as illustrated in FIG. 9.

In a fabrication process of an SOI (Silicon on Insulator) substrate, the vertical surface and the horizontal surface, which have been formed by the first polishing tape 3A, are removed by a grinder. More specifically, as illustrated in FIG. 7A and FIG. 7B, a device substrate W1, which has been polished by the polishing apparatus according to the embodiment, and a silicon substrate W2 are stuck together, and a back side of the device substrate W1 is scraped away by the grinder. As a result, the SOI substrate as illustrated in FIG. 7C is obtained. Only a smooth vertical surface, which has been formed by the second polishing tape 3B having the fine polishing surface, remains on the device substrate W1.

The previous description of embodiments is provided to enable a person skilled in the art to make and use the present invention. Moreover, various modifications to these embodiments will be readily apparent to those skilled in the art, and the generic principles and specific examples defined herein may be applied to other embodiments. Therefore, the present invention is not intended to be limited to the embodiments described herein but is to be accorded the widest scope as defined by limitation of the claims and equivalents.

What is claimed is:

1. A substrate polishing apparatus, comprising:
   a substrate holder having a substrate holding surface and configured to rotate a substrate;
   a first polishing tool configured to press against an edge portion of the substrate to polish the edge portion, the first polishing tool having a first polishing surface which is parallel to the substrate holding surface;
   a first vertically-moving mechanism configured to move the first polishing tool in a vertical direction, the first vertically-moving mechanism being coupled to the first polishing tool;
   a second polishing tool configured to press against the edge portion of the substrate to polish the edge portion, the second polishing tool being located more inwardly than the first polishing tool with respect to a radial direction of the substrate, the second polishing tool having a second polishing surface which is parallel to the substrate holding surface; and
   a second vertically-moving mechanism configured to move the second polishing tool in a vertical direction, the second vertically-moving mechanism being coupled to the second polishing tool;
   the first polishing tool having a polishing surface more abrasive than a polishing surface of the second polishing tool;
   the first polishing tool, the first vertically-moving mechanism, the second polishing tool, and the second vertically-moving mechanism being located higher than the substrate holding surface.

2. The substrate polishing apparatus according to claim 1, further comprising:
   the second polishing tool configured for contact with the edge portion of the substrate after a predetermined time has elapsed from a time when the first polishing tool is configured for contact with the edge portion of the substrate.

3. The substrate polishing apparatus according to claim 2, wherein a first width of the first polishing tool contacting the edge portion of the substrate in a radial direction is equal to or larger than a second width of the second polishing tool contacting the edge portion of the substrate in the radial direction.

4. The substrate polishing apparatus according to claim 1, wherein the first polishing tool is configured for a removal rate of the substrate that is higher than a removal rate of the substrate by the second polishing tool.

5. The substrate polishing apparatus according to claim 1, wherein the first polishing tool is configured as a polishing tool for rough-polishing of the substrate, and the second polishing tool is configured as a polishing tool for finish-polishing of the substrate.

6. The substrate polishing apparatus according to claim 1, wherein at least one of the first polishing tool and the second polishing tool comprises a polishing tape.

7. The substrate polishing apparatus according to claim 1, wherein at least one of the first polishing tool and the second polishing tool comprises a grindstone.

8. The substrate polishing apparatus according to claim 1, wherein first vertically-moving mechanism is located above the first polishing tool, and the second vertically-moving mechanism is located above the second polishing tool.

* * * * *